United States Patent
Lee

(10) Patent No.: US 11,250,916 B2
(45) Date of Patent: Feb. 15, 2022

(54) VERTICAL MEMORY DEVICE HAVING IMPROVED ELECTRICAL CHARACTERISTICS AND METHOD OF OPERATING THE SAME

(71) Applicant: Samsung Electronics Co., Ltd., Suwon-si (KR)

(72) Inventor: Yo-han Lee, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/173,824

(22) Filed: Feb. 11, 2021

(65) Prior Publication Data

US 2021/0166768 A1     Jun. 3, 2021

Related U.S. Application Data

(63) Continuation of application No. 16/936,936, filed on Jul. 23, 2020, now Pat. No. 10,694,397, which is a
(Continued)

(30) Foreign Application Priority Data

Nov. 13, 2018     (KR) .......................... 10-2018-0139408

(51) Int. Cl.
  *G11C 16/16* (2006.01)
  *G11C 16/08* (2006.01)
  (Continued)

(52) U.S. Cl.
  CPC .......... *G11C 16/16* (2013.01); *G11C 16/0483* (2013.01); *G11C 16/08* (2013.01); *G11C 16/10* (2013.01); *G11C 16/3445* (2013.01); *H01L 24/05* (2013.01); *H01L 24/08* (2013.01); *H01L 25/0657* (2013.01); *H01L 25/18* (2013.01); *H01L 27/11556* (2013.01); *H01L 27/11582* (2013.01); *H01L 2224/05147* (2013.01);
  (Continued)

(58) Field of Classification Search
  CPC ..... G11C 29/24; G11C 16/0483; G11C 16/16; G11C 16/08; G11C 16/10; G11C 16/3445; H01L 24/05; H01L 24/08
  See application file for complete search history.

(56) References Cited

U.S. PATENT DOCUMENTS 6,493,261 B1    12/2002    Hamilton et al.
7,869,280 B2    1/2011     Kosaki et al.
(Continued)

*Primary Examiner* — Han Yang
(74) *Attorney, Agent, or Firm* — Harness, Dickey & Pierce, P.L.C.

(57) ABSTRACT

A memory device including at least one dummy word line over a substrate; a plurality of word lines over the dummy word line; and a plurality of vertical holes extending through the at least one dummy word line and the plurality of word lines in a direction perpendicular to the substrate and classified into channel holes and dummy holes, each of the channel holes being connected to a bit line. The method including performing an erase operation on dummy cells formed as the dummy word line and the dummy holes; verifying the erase operation; and performing a program operation on at least one of the dummy cells such that the at least one dummy cell has a higher threshold voltage than main cells formed as the dummy word line and the channel holes.

20 Claims, 15 Drawing Sheets

Related U.S. Application Data continuation-in-part of application No. 16/530,265, filed on Aug. 2, 2019, now Pat. No. 10,803,952.

(51) Int. Cl.

| | | |
|---|---|---|
| *G11C 16/10* | (2006.01) | |
| *G11C 16/34* | (2006.01) | |
| *H01L 25/065* | (2006.01) | |
| *H01L 25/18* | (2006.01) | |
| *H01L 23/00* | (2006.01) | |
| *H01L 27/11556* | (2017.01) | |
| *H01L 27/11582* | (2017.01) | |
| *G11C 16/04* | (2006.01) | |

(52) U.S. Cl.
CPC ............ *H01L 2224/08145* (2013.01); *H01L 2924/1431* (2013.01); *H01L 2924/14511* (2013.01)

(56) References Cited

U.S. PATENT DOCUMENTS

| | | |
|---|---|---|
| 9,391,087 B2 | 7/2016 | Shibata et al. |
| 9,449,690 B2 | 9/2016 | Kaza et al. |
| 9,543,022 B2 | 1/2017 | Hashimoto et al. |
| 9,773,546 B2 | 9/2017 | Lee et al. |
| 10,297,330 B2 | 5/2019 | Zhang et al. |
| 2006/0239077 A1 | 10/2006 | Park et al. |
| 2009/0135656 A1* | 5/2009 | Park ................. G11C 29/50004 365/185.19 |
| 2015/0085574 A1 | 3/2015 | Raghu et al. |
| 2016/0012895 A1 | 1/2016 | Ahn et al. |
| 2016/0049421 A1 | 2/2016 | Zhang et al. |
| 2019/0287618 A1 | 9/2019 | Kimura et al. |

\* cited by examiner

| SSL | Float |
| --- | --- |
| DWL1 | Vwe |
| GSL | Float |
| SUB | V_ERS |

VERTICAL MEMORY DEVICE HAVING IMPROVED ELECTRICAL CHARACTERISTICS AND METHOD OF OPERATING THE SAME

CROSS-REFERENCE TO RELATED APPLICATION

This application is a continuation application of U.S. application Ser. No. 16/936,936, filed on Jul. 23, 2020, which is a continuation-in-part of U.S. application Ser. No. 16/530,265, filed on Aug. 2, 2019, which claims the benefit of Korean Patent Application No. 10-2018-0139408, filed on Nov. 13, 2018, in the Korean Intellectual Property Office, the entire disclosure of each of which is incorporated herein in its entirety by reference.

BACKGROUND

Example embodiments of the inventive concepts relate to a vertical memory device and/or a method of operating the vertical memory device. For example, at least some example embodiments relate to a vertical memory device having improved electrical characteristics and/or a method of operating the vertical memory device.

Recently, as information communication devices become multifunctional, it may be desirable to have memory devices with larger capacity and more highly integrated. However, along with the reduction in sizes of memory cells for higher integration, operation circuits and/or wiring structures included in memory devices for operations and electrical connections of the memory devices may become more complicated. Therefore, there is a demand for a memory device having excellent electrical characteristics and data reliability while exhibiting an improved degree of integration.

SUMMARY

Example embodiments of the inventive concepts provide a vertical memory device having improved electrical characteristics and/or a method of operating the vertical memory device. For example, example embodiments of the inventive concepts provide a memory device, in which a dummy hole is electrically separated from a substrate by programming a dummy cell, and/or a method of operating the memory device.

At least some example embodiments of the inventive concepts relate to a method of operating a memory device. The memory device comprising a memory cell region including a first metal pad, a peripheral circuit region including a second metal pad and vertically connected to the memory cell region by the first metal pad and the second metal pad, a substrate, at least one dummy word line over the substrate, a plurality of word lines over the at least one dummy word line; and a plurality of vertical holes, the plurality of vertical holes extending through the at least one dummy word line and the plurality of word lines in a direction perpendicular to the substrate, the plurality of vertical holes including channel holes and dummy holes, the channel holes being ones of the plurality of vertical holes connected to a bit line. The method includes performing an erase operation on dummy cells, the dummy cells each including one of the at least one dummy word line and ones of the dummy holes; verifying the erase operation; and performing a program operation on at least one of the dummy cells such that threshold voltages of the dummy cells are higher than threshold voltages of main cells, the main cells each including one of the at least one dummy word line and ones of the channel holes.

Other example embodiments of the inventive concepts relate to a method of operating a memory device. The memory device comprising a memory cell region including a first metal pad, a peripheral circuit region including a second metal pad and vertically connected to the memory cell region by the first metal pad and the second metal pad, a substrate, a first dummy word line over the substrate, a second dummy word line over the first dummy word line, a plurality of word lines over the second dummy word line, and a plurality of vertical holes, the plurality of vertical holes extending through the first dummy word line, the second dummy word line, and the plurality of word lines in a direction perpendicular to the substrate, each of the plurality of vertical holes including one of first vertical holes and second vertical holes. The method includes performing an erase operation on first dummy cells and second dummy cells, the first dummy cells including ones of the first vertical holes and the first dummy word line, and the second dummy cells including ones of the second vertical holes and the second dummy word line; verifying the erase operation; controlling a threshold voltage of each of the first dummy cells and main cells in response to verifying that the erase operation is completed, the main cells including ones the second vertical holes and the first dummy word line; and programming the second dummy cells.

Other example embodiments of the inventive concepts relate to a non-volatile memory device including: a non-volatile memory device including a memory cell region including a first metal pad; a peripheral circuit region including a second metal pad and vertically connected to the memory cell region by the first metal pad and the second metal pad; a substrate; a plurality of gate conductive layers including at least one dummy word line over the substrate and a plurality of word lines over the at least one dummy word line; a plurality of bit lines over the plurality of gate conductive layers, the plurality of bit lines being apart from each other in a first direction and extending in a second direction, the second direction being perpendicular to the first direction; a plurality of vertical holes extending through the plurality of gate conductive layers in a direction perpendicular to the substrate, the plurality of vertical holes including channel holes and dummy holes, the channel holes being ones of the plurality of vertical holes connected to respective ones of the plurality of bit lines; dummy cells each including one of the at least one dummy word line and ones of the dummy holes; main cells each including one of the plurality of word lines and ones of the channel holes; and a row decoder configured to apply a voltage to each of the plurality of gate conductive layers such that when a turn-on voltage associated with the main cells is applied to the at least one dummy word line, the dummy cells are configured to be turned off.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments of the inventive concepts will be described in detail with reference to the accompanying drawings.

Figure 1:
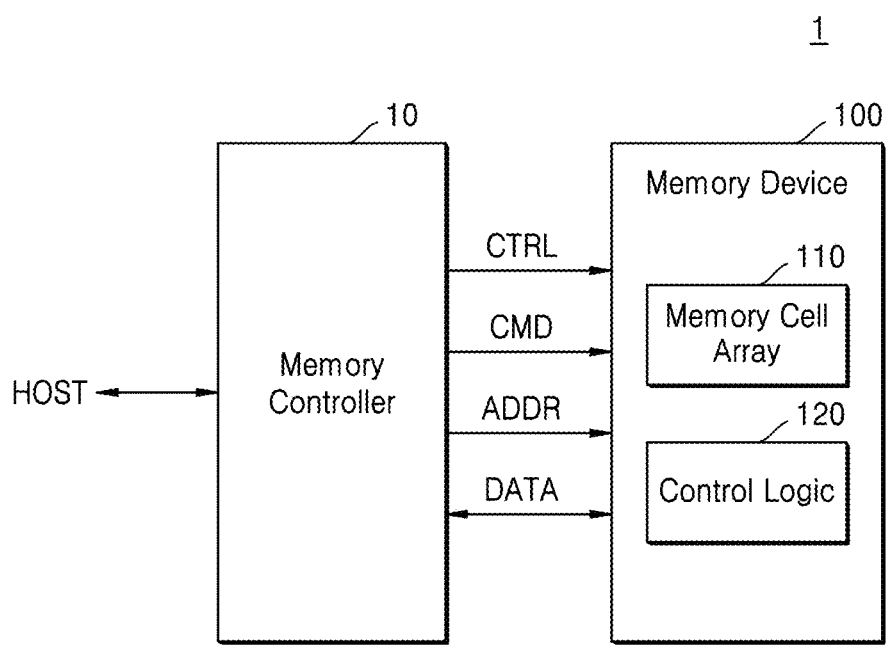
FIG. 1 is a block diagram illustrating a memory system according to an example embodiment.

FIG. 1 is a block diagram illustrating a memory system according to an example embodiment.

Referring to FIG. 1, a memory system 1 may include a memory controller 10 and a memory device 100, and the memory device 100 may include a memory cell array 110 and a control logic 120.

The memory device 100 may include a non-volatile memory device. In some example embodiments, the memory system 1 may be implemented as internal memory embedded in an electronic device, and may include, for example, a Universal Flash Storage (UFS) memory device, an embedded Multi-Media Card (eMMC), or a Solid State Drive (SSD). In other example embodiments, the memory system 1 may be implemented as external memory detachably attached to an electronic device, and may include, for example, a UFS memory card, Compact Flash (CF), Secure Digital (SD), Micro-Secure Digital (Micro-SD), Mini-Secure Digital (Mini-SD), extreme Digital (xD), or Memory Stick.

The memory controller 10 may control the memory device 100 such that data stored in the memory device 100 is read or data is programmed into the memory device 100 in response to a read/write request from a host HOST. For example, the memory controller 10 may control program, read, and/or erase operations for the memory device 100 by providing an address ADDR, a command CMD, and a control signal CTRL to the memory device 100. In addition, data DATA to be programmed and/or read data DATA may be transmitted and received between the memory controller 10 and the memory device 100.

For example, the memory device 100 may include a single memory chip. As another example, the memory device 100 may include a plurality of memory chips. One memory chip may include a single die or a plurality of dies. One die may include a single plane or a plurality of planes. One plane may include a plurality of memory blocks, each of the memory blocks may include a plurality of pages, and each of the pages may include a plurality of sectors.

In addition, the memory cell array 110 may include a plurality of dummy cells and a plurality of main cells. For example, the memory cell array 110 may include at least one dummy word line and a plurality of word lines, which are arranged on a semiconductor substrate in this stated order, and a plurality of vertical holes extending through the dummy word line and the word lines in a direction perpendicular to the semiconductor substrate. The plurality of vertical holes may be classified into channel holes, which are connected to bit lines, and dummy holes other than the channel holes. For example, each of the dummy cells may be formed as the dummy word line and each dummy hole. In addition, each of the main cell may be formed as the dummy word line and a channel hole.

The control logic 120 may receive the command CMD and the address ADDR from the memory controller 10 and may control erase and/or program operations for the dummy cells based thereon. In an example embodiment, the control logic 120 may control erase and erase-verify operations for the dummy cells based on the command CMD and the address ADDR. In addition, the control logic 120 may control a program operation to be performed on at least one of the dummy cells such that the at least one dummy cell has a threshold voltage higher than threshold voltages of the main cells. This will be described below in detail.

According to example embodiments of the inventive concepts, the control logic 120 may program the dummy cells, thereby electrically separating the semiconductor substrate from the dummy holes not connected to the bit lines. Thus, the memory device 100 may reduce loading due to the dummy holes during a memory operation such as data reading and thus have improved electrical characteristics.

Figure 2:
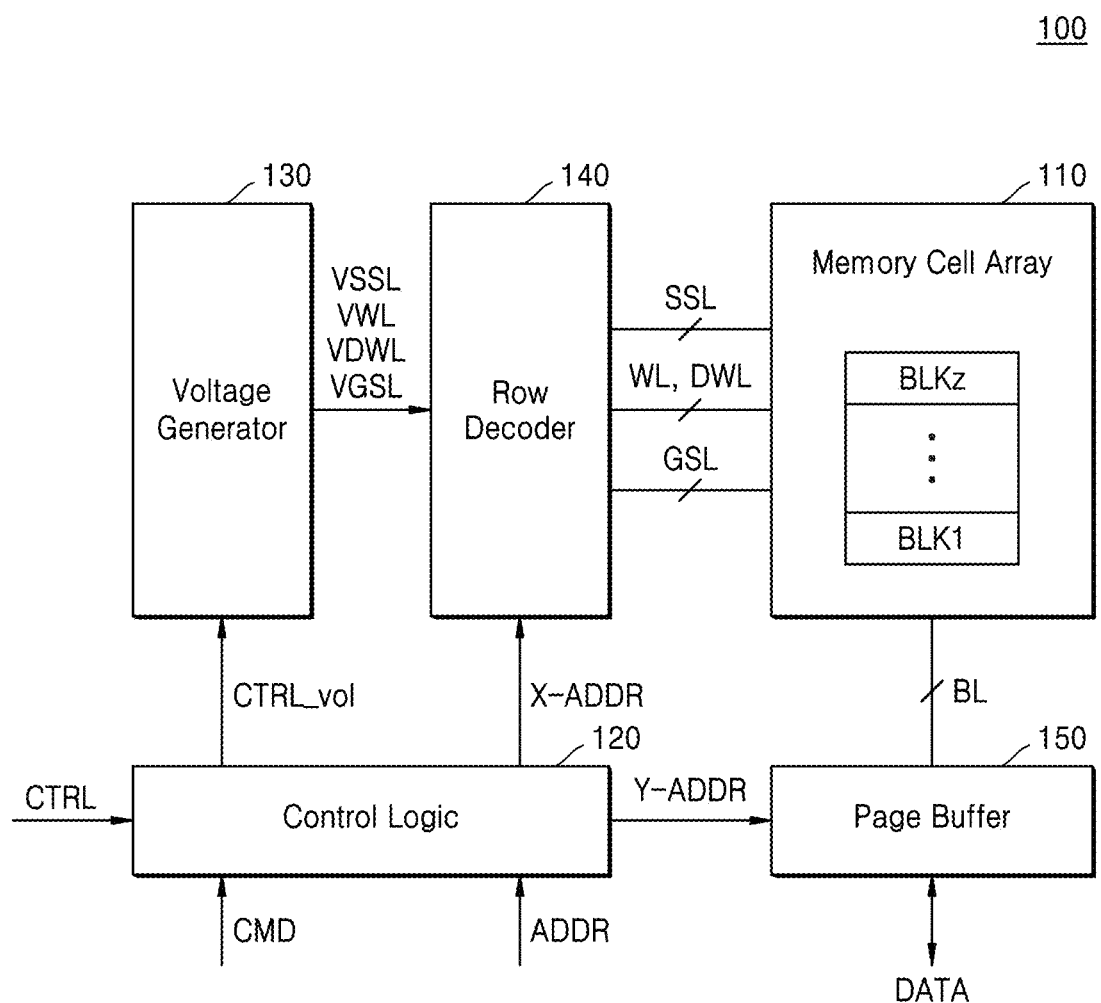
FIG. 2 is a block diagram illustrating, in detail, a memory device according to an example embodiment.

FIG. 2 is a block diagram illustrating, in detail, a memory device according to an example embodiment. For example, FIG. 2 may illustrate an implementation example of the memory device 100 of FIG. 1.

Referring to FIG. 2, the memory device 100 may include the memory cell array 110, the control logic 120, a voltage generator 130, a row decoder 140, and a page buffer 150. Although not shown in FIG. 2, the memory device 100 may further include other various components related to memory operations, such as data input/output circuits or input/output interfaces.

The memory cell array 110 may include a plurality of memory cells and may be connected to word lines WL, dummy word lines DWL, string select lines SSL, ground select lines GSL, common source lines CSL, and bit lines BL. The memory cell array 110 may be connected to the row decoder 140 via the word lines WL, the dummy word lines DWL, the string select lines SSL, and the ground select lines GSL and may be connected to the page buffer 150 via the bit lines BL.

For example, each of the plurality of memory cells included in the memory cell array 110 may include a non-volatile memory cell maintaining stored data even though power supplied thereto is shut off. Specifically, when each memory cell is a non-volatile memory cell, the memory device 100 may include electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or the like. Hereinafter, although example embodiments of the inventive concepts will be described with reference to the case where the plurality of memory cells are NAND flash memory cells, it will be understood that example embodiments of the inventive concepts are not limited thereto.

The memory cell array 110 may include a plurality of memory blocks BLK1 to BLKz, and each of the memory blocks BLK1 to BLKz may have a planar structure or a 3-dimensional structure. The memory cell array 110 may include at least one of a single level cell block including single level cells (SLCs), a multi-level cell block including multi-level cells (MLCs), a triple level cell block including triple level cells (TLCs), and a quad level cell block including quad level cells (QLCs). For example, some of the plurality of memory blocks BLK1 to BLKz may be single level cell blocks, and the others may be multi-level cell blocks, triple level cell blocks, or quad level cell blocks.

The control logic 120 may output various internal control signals for programming data into the memory cell array 110 or reading data from the memory cell array 110 based on the command CMD, the address ADDR, and the control signal CTRL, which are received from the memory controller 10. For example, the control logic 120 may output a voltage control signal CTRL_vol for controlling levels of various voltages generated by the voltage generator 130. The control logic 120 may provide a row address X-ADDR to the row decoder 140 and provide a column address Y-ADDR to the page buffer 150.

The voltage generator 130 may generate various voltages used in the memory device 100. For example, the voltage generator 130 may generate a word line voltage VWL, a string select line voltage VSSL, and a ground select line voltage VGSL. In addition, the voltage generator 130 may further generate a dummy word line voltage VDWL.

The row decoder 140 may select at least one of word lines of a memory block selected in response to the row address X-ADDR. During a program operation, the row decoder 140 may provide a program voltage as the word line voltage VWL to a word line of a memory cell selected in response to the row address X-ADDR and may provide a pass voltage as the word line voltage VWL to a word line of a non-selected memory cell.

The page buffer 150 may be operated as a write driver or a sense amplifier. During a program operation, the page buffer 150 may be operated as a write driver and thus apply, to the bit lines BL, a voltage according to the data DATA required to be stored in the memory cell array 110. During a reading operation, the page buffer 150 may be operated as a sense amplifier and thus sense the data DATA stored in the memory cell array 110.

The control logic 120 may control the voltage generator 130, the row decoder 140, and the page buffer 150 to perform an erase or program operation on the dummy cells. For example, during a program operation for the dummy cells, the control logic 120 may control the voltage generator 130 and the row decoder 140 such that a program voltage is applied to the dummy word lines DWL for a desired (or, alternatively, a preset) time period.

In an example embodiment, the control logic 120 may control a program operation for the dummy cells such that a threshold voltage of each dummy cell has a higher level than a threshold voltage of each main cell. In other words, the control logic 120 may control the program operation for the dummy cells such that the threshold voltage of each dummy cell has a higher level than a turn-on voltage of each main cell. This will be described below in detail.

Figure 3:
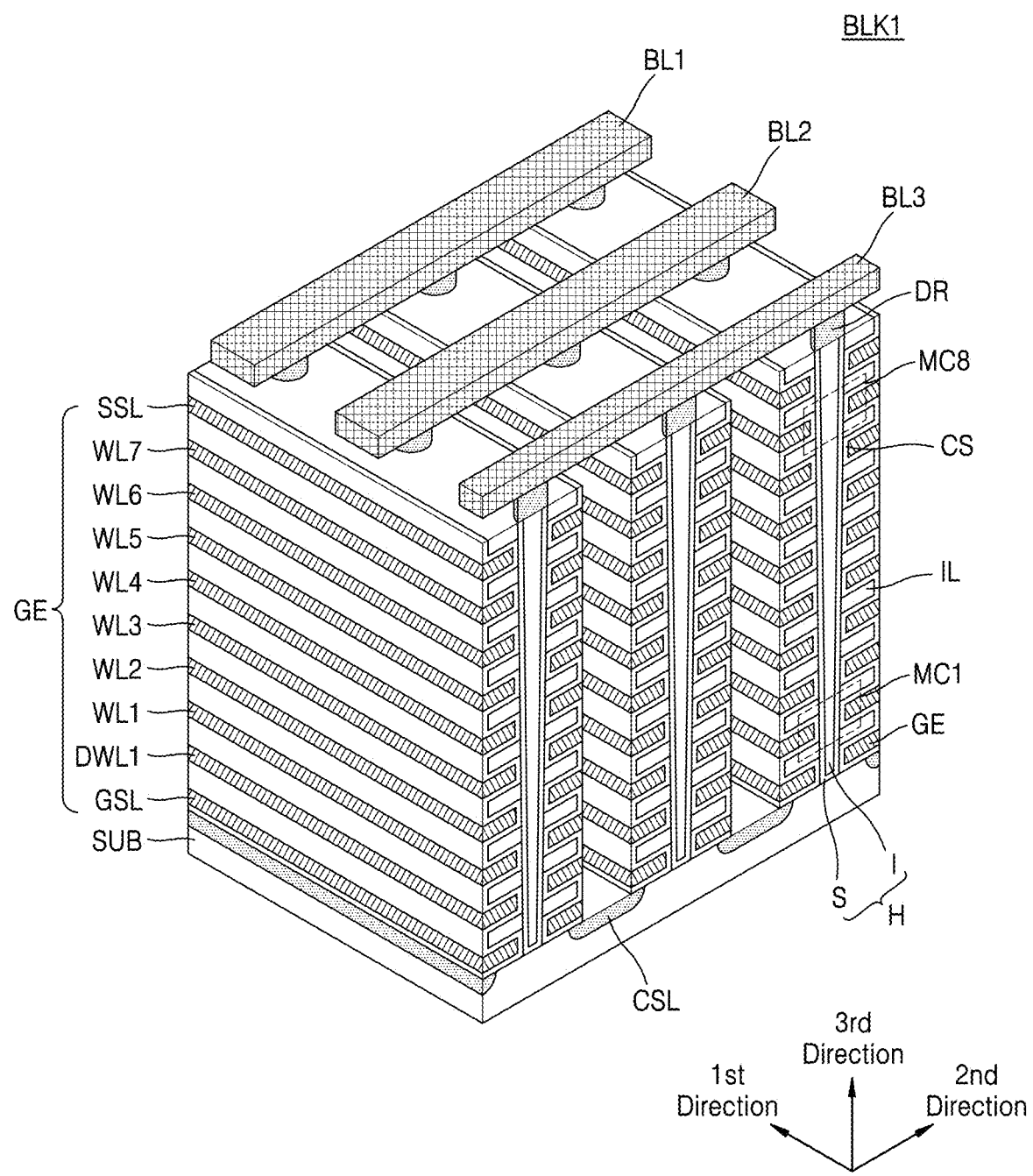
FIG. 3 is a perspective view illustrating an implementation example of a first memory block among memory blocks of FIG. 2.

FIG. 3 is a perspective view illustrating an implementation example of a first memory block among the memory blocks of FIG. 2.

Referring to FIG. 3, a first memory block BLK1 may be formed in a direction perpendicular to a substrate SUB. Although the first memory block BLK1 is shown in FIG. 3 as including two select lines GSL and SSL, one dummy word line DWL, seven word lines WL1 to WL7, and three bit lines BL1 to BL3, the number of each of the components included in the first memory block BLK1 may be actually greater or less than that set forth above.

The substrate SUB may include a polysilicon layer doped to a first conductivity type (for example, p-type). The substrate SUB may include a bulk silicon substrate, a silicon-on-insulator (SOI) substrate, a germanium substrate, a germanium-on-insulator (GOI) substrate, a silicon-germanium substrate, or a substrate of an epitaxial thin film obtained by selective epitaxial growth (SEG). The substrate SUB may include a semiconductor material, for example, at least one selected from the group consisting of silicon (Si), germanium (Ge), silicon germanium (SiGe), gallium arsenide (GaAs), indium gallium arsenide (InGaAs), and aluminum gallium arsenide (AlGaAs).

In the substrate SUB, a common source line CSL extending on the substrate SUB in a first direction and doped with second conductivity-type (for example, n-type) impurities may be provided. Over a region of the substrate SUB between two adjacent common source lines CSL, a plurality of insulating films IL extending in the first direction may be sequentially arranged in a third direction, and the plurality of insulating films IL may be apart from each other in the third direction by as much as a specific distance. For example, each of the plurality of insulating films IL may include an insulating material such as silicon oxide.

On the region of the substrate SUB between the two adjacent common source lines CSL, a plurality of vertical holes H, each penetrating the plurality of insulating films IL in the third direction, may be sequentially arranged in the first direction. For example, the plurality of vertical holes H may contact the substrate SUB through the plurality of insulating films IL. Specifically, a surface layer S of each vertical hole H may include a silicon material doped to a first conductivity type and may function as a channel region. In addition, an inner layer I of each vertical hole H may include an insulating material, such as silicon oxide, or an air gap.

In a region between the two adjacent common source lines CSL, a charge storage layer CS may be arranged along exposed surfaces of the insulating films IL, the vertical holes H, and the substrate SUB. The charge storage layer CS may include a gate insulating layer (otherwise referred to as the term "tunneling insulating layer"), a charge trap layer, and a blocking insulating layer. For example, the charge storage layer CS may have an oxide-nitride-oxide (ONO) structure. In addition, in the region between the two adjacent common source lines CSL, gate electrodes GE, such as the select lines GSL and SSL, a dummy word line DWL, and the word lines WL1 to WL7, may be arranged on exposed surfaces of the charge storage layer CS.

Drains or drain contacts DR may be respectively arranged on the vertical holes H. For example, the drains or drain contacts DR may include a silicon material doped with impurities of a second conductivity type. The bit lines BL1 to BL3, which extend in a second direction, may be arranged on the drain contacts DR to be apart from each other by as much as a specific distance in the first direction.

Figure 4:
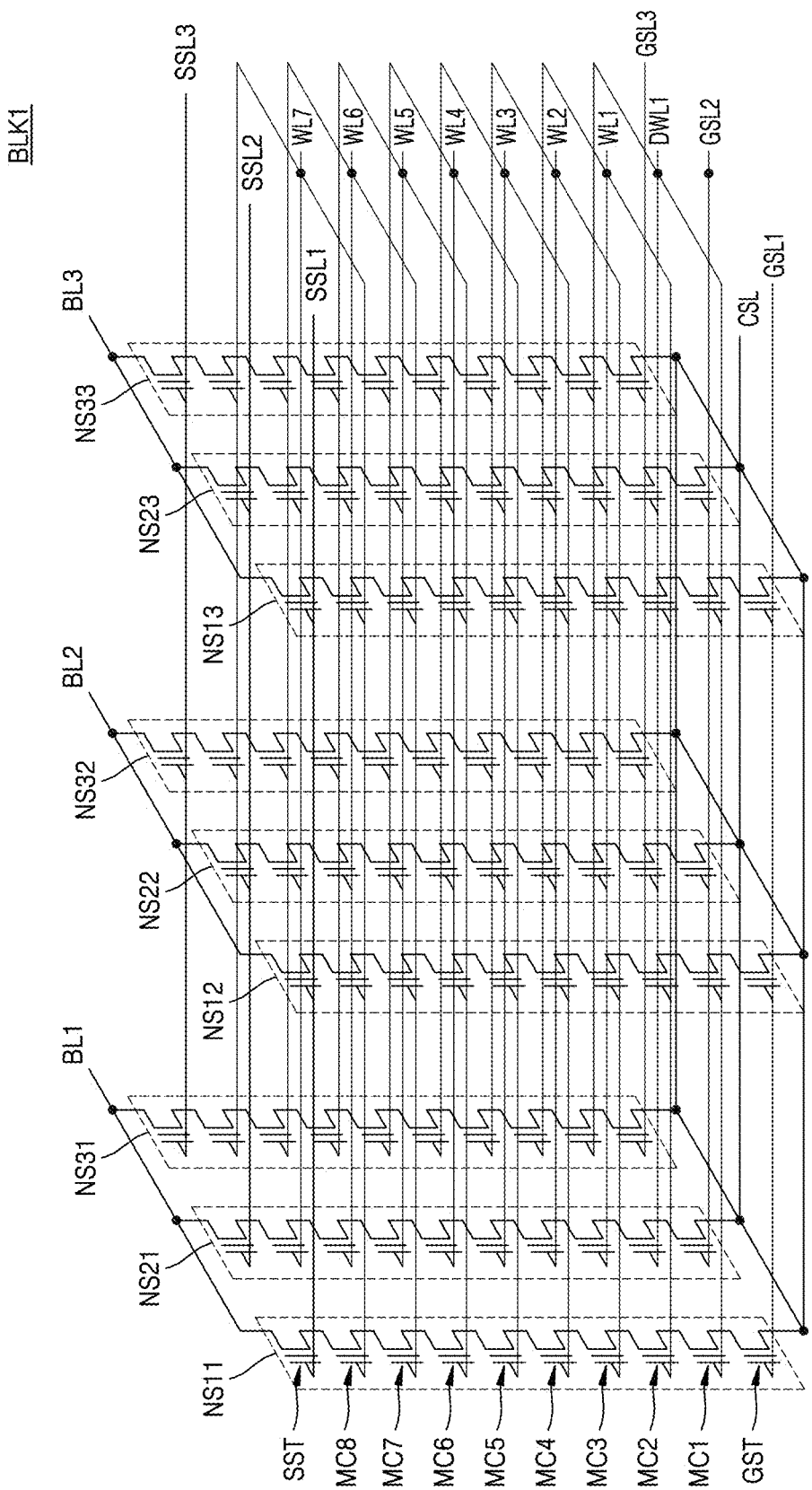
FIG. 4 is a circuit diagram illustrating an equivalent circuit of the first memory block among the memory blocks of FIG. 2.

FIG. 4 is a circuit diagram illustrating an equivalent circuit of the first memory block among the memory blocks of FIG. 2.

Referring to FIG. 4, the first memory block BLK1 may be vertical-structure NAND flash memory, and each of the memory blocks BLK1 to BLKz shown in FIG. 2 may be implemented as in FIG. 4. The first memory block BLK1 may include a plurality of NAND cell strings NS11 to NS33, a dummy word line DWL, a plurality of word lines WL1 to WL7, a plurality of bit lines BL1 to BL3, a plurality of ground select lines GSL1 to GSL3, a plurality of string select lines SSL1 to SSL3, and the common source line CSL. Here, the number of NAND cell strings, the number of dummy word lines, the number of word lines, the number of bit lines, the number of ground select lines, and the number of string select lines may variously vary with example embodiments.

NAND cell strings NS11, NS21, and NS31 are arranged between a first bit line BL1 and the common source line CSL, NAND cell strings NS12, NS22, and NS32 are arranged between a second bit line BL2 and the common source line CSL, and NAND cell strings NS13, NS23, and NS33 are arranged between a third bit line BL3 and the common source line CSL. Each NAND cell string (for example, NS11) may include a string select transistor SST, a plurality of memory cells MC1 to MC8, and a ground select transistor GST, which are connected in series in this stated order. For example, a first memory cell MC1 may be connected to a dummy word line DWL1 and may be referred to as a main cell.

NAND cell strings commonly connected to one bit line may constitute one column. For example, the NAND cell strings NS11, NS21, and NS31 commonly connected to the first bit line BL1 may correspond to a first column, the NAND cell strings NS12, NS22, and NS32 commonly connected to the second bit line BL2 may correspond to a second column, and the NAND cell strings NS13, NS23, and NS33 commonly connected to the third bit line BL3 may correspond to a third column.

NAND cell strings connected to one string select line may constitute one row. For example, NAND cell strings NS11, NS12, and NS13 connected to a first string select line SSL1 may correspond to a first row, NAND cell strings NS21, NS22, and NS23 connected to a second string select line SSL2 may correspond to a second row, and NAND cell strings NS31, NS32, and NS33 connected to a third string select line SSL3 may correspond to a third row.

The string select transistor SST may be connected to a corresponding string select line (for example, one of SSL1 to SSL3). Each of the plurality of memory cells MC1 to MC8 may be connected to a corresponding word line (for example, one of WL1 to WL8). The ground select transistor GST may be connected to a corresponding ground select line (for example, one of GSL1 to GSL3), and the string select transistor SST may be connected to a corresponding bit line (for example, one of BL1 to BL3). The ground select transistor GST may be connected to the common source line CSL.

In the present example embodiment, word lines (for example, WL1) at the same height are commonly connected to each other, the string select lines SL1 to SL3 are separated from each other, and the ground select lines GSL1 to GSL3 are also separated from each other. For example, when memory cells connected to a first word line WL1 and included in the NAND cell strings NS11, NS12, and NS13 corresponding to the first column are programmed, the first word line WL1 and the first string select line SSL1 are selected. However, example embodiments of the inventive concepts are not limited thereto, and in another example embodiment, the ground select lines GSL1 to GSL3 may be commonly connected to each other.

Figure 5A:
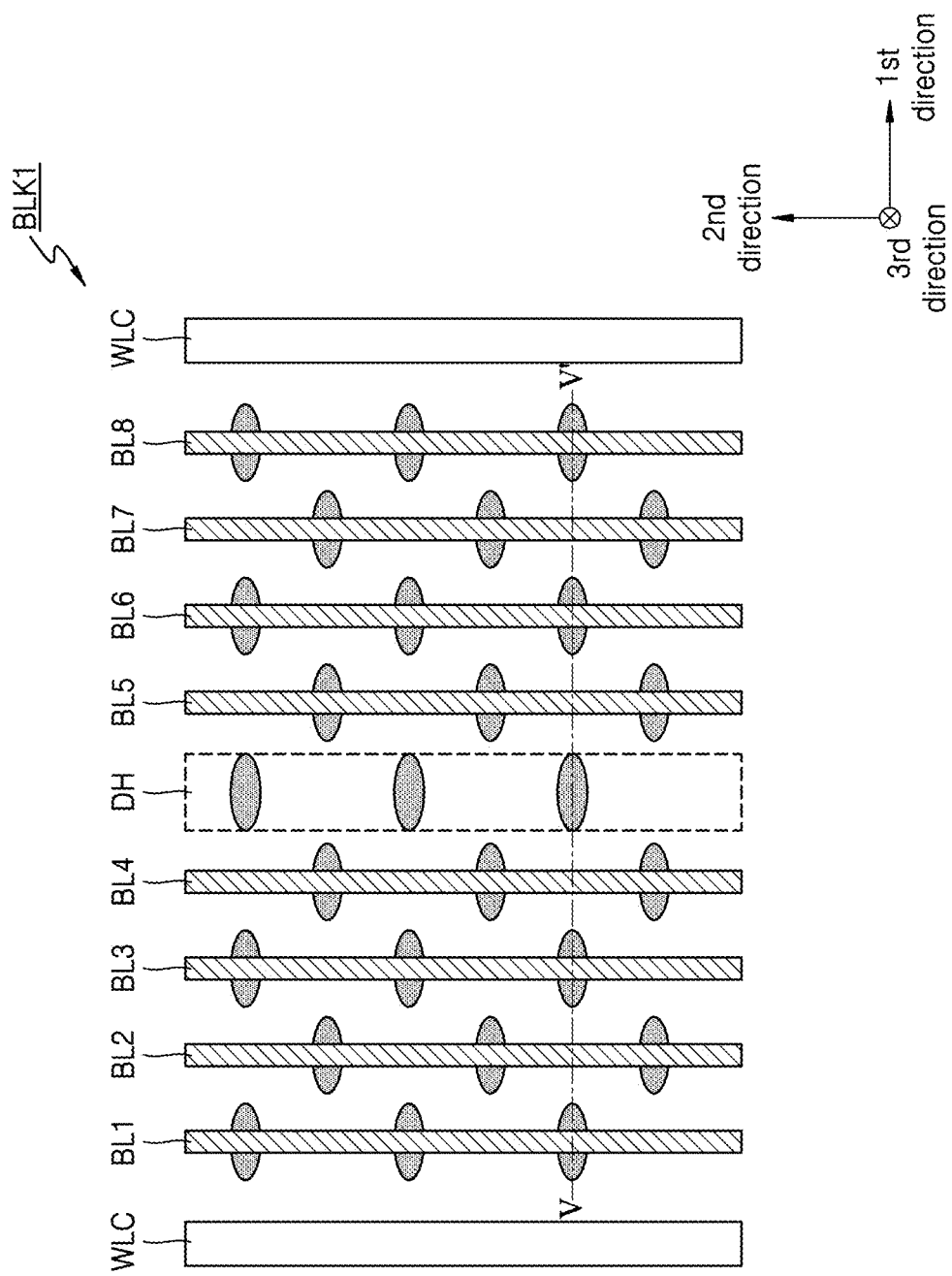
FIG. 5A illustrates a top view of a first memory block according to an example embodiment.
Figure 5B:
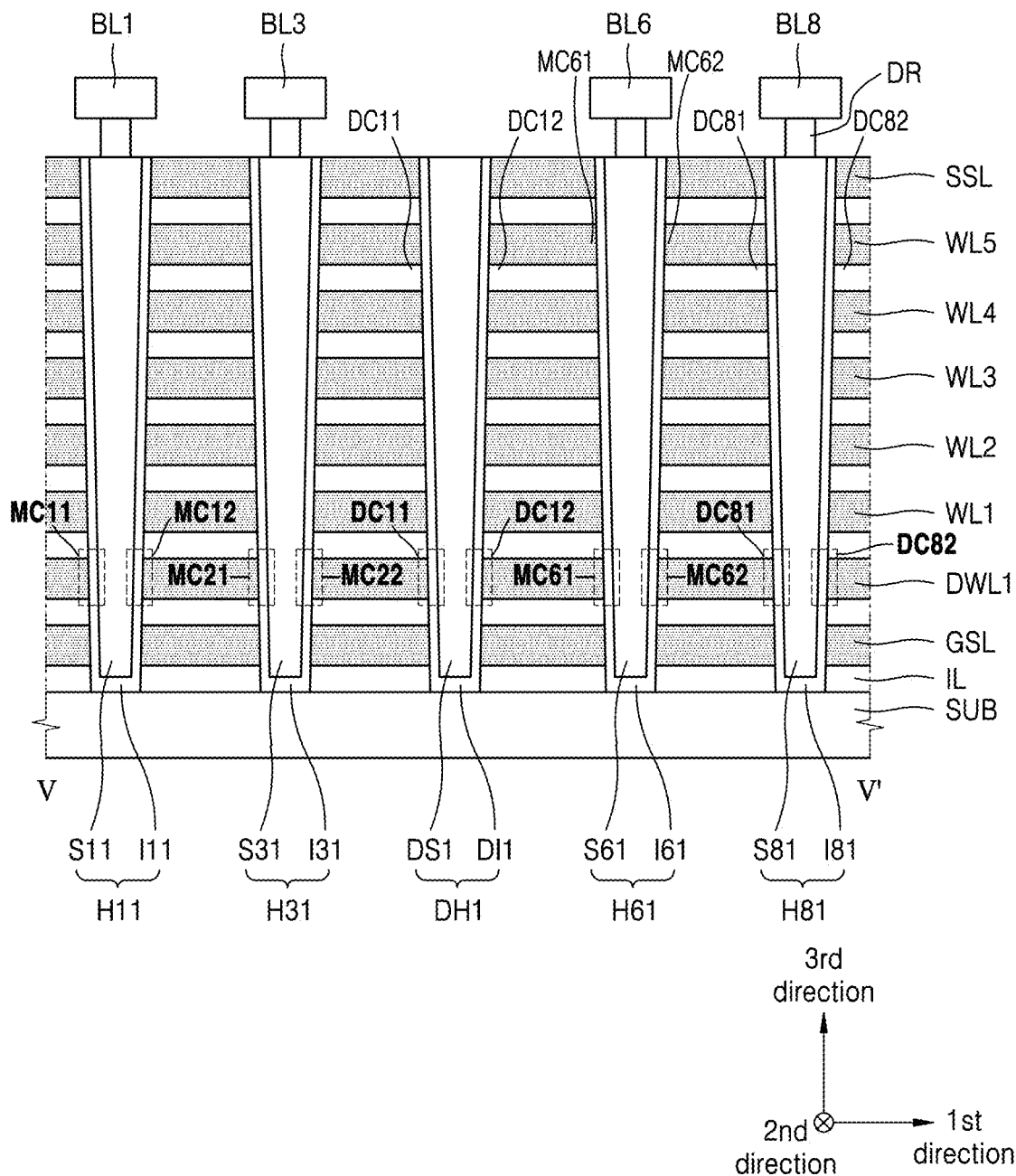
FIG. 5B illustrates a cross-sectional configuration taken along a line V-V' of FIG. 5A.

FIG. 5A illustrates a top view of a first memory block according to an example embodiment, and FIG. 5B illustrates a cross-sectional configuration taken along a line V-V' of FIG. 5A.

Referring to FIGS. 5A and 5B, the memory block BLK1 may include word line cut regions WLC apart from each other in the first direction and extending in the second direction. In addition, the memory block BLK1 may include a plurality of vertical holes (for example, H11, H31, DH1, H61, and H81), which are arranged between the word line cut regions WLC in the first and second directions, and bit lines BL1 to BL8 extending in the second direction and arranged apart from each other in the first direction.

In an example embodiment, the vertical holes may be classified into channel holes connected to the bit lines and dummy holes DH other than the channel holes. As an example, each vertical hole connected to the first bit line BL1 is a channel hole (for example, H11), and memory cells formed as the channel hole H11 may perform a data storage function. On the other hand, the dummy holes DH are vertical holes not connected to the bit lines BL1 to BL8 unlike the channel holes, and memory cells formed as the dummy holes DH are not able to perform the data storage function.

Referring to FIG. 5B, a ground select line GSL, a first dummy word line DWL1, and a plurality of word lines WL1 to WL6 may be arranged over the substrate SUB. The insulating films IL may be sequentially arranged between the substrate SUB, the ground select line GSL, the first dummy word line DWL1, and the word lines WL1 to WL6. In addition, channel holes H11, H31, H61, and H81 and a dummy hole DH1 may extend, in the third direction, through the insulating films IL, the first dummy word line DWL1, the word lines WL1 to WL6, and a string select line SSL.

Each of the channel holes H11, H31, H61, and H81 and the first dummy word line DWL1 may form main cells. For example, a first channel hole H11 and the first dummy word line DWL1 may form first main cells MC11 and MC12, a third channel hole H31 and the first dummy word line DWL1 may form second main cells MC21 and MC22, a sixth channel hole H61 and the first dummy word line DWL1 may form sixth main cells MC61 and MC62, and a eighth channel hole H81 and the first dummy word line DWL1 may form eighth main cells MC81 and MC82. In addition, the dummy hole DH1 and the first dummy word line DWL1 may form dummy cells DC11 and DC12.

In an example embodiment, each of the dummy cells DC11 and DC12 may be programmed to have a higher threshold voltage than main cells MC11 to MC82. Alternatively, each of the dummy cells DC11 and DC12 may be programmed to have a threshold voltage having a higher level than turn-on voltages of the main cells MC11 to MC82. As an example, for a desired (or, alternatively, a preset) time period for which a program operation for the dummy cells DC11 and DC12 is performed, an inhibit voltage may be applied to bit lines BL1, BL3, BL6, and BL8, and a voltage having a level enough to cause Fowler-Nordheim (FN) tunnelling from a surface layer DS1 may be applied to the first dummy word line DWL1. Thus, during a memory operation of the memory device 100, such as reading, as the dummy cells DC11 and DC12 are turned off, the dummy hole DH1 may be electrically separated from the substrate SUB.

Figures 6A, 6B:
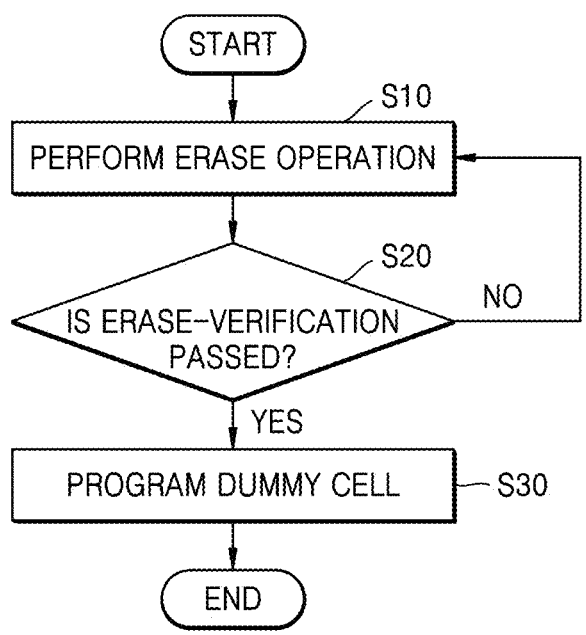
FIGS. 6A to 6C are diagrams illustrating a method of operating a memory device.
Figure 6C:
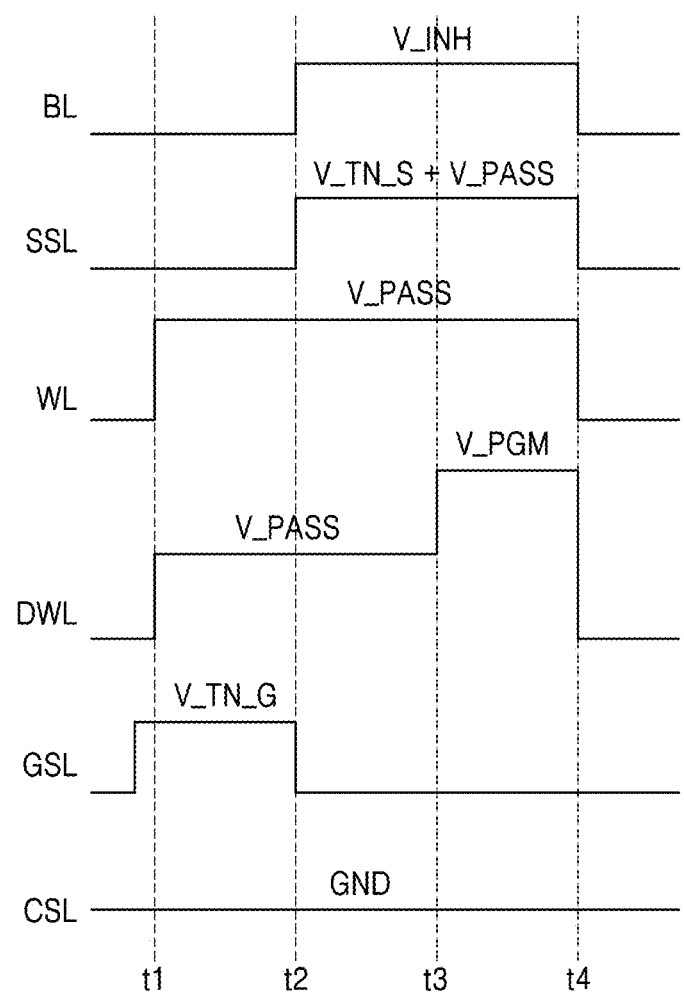

FIGS. 6A to 6C are diagrams illustrating a method of operating a memory device. Specifically, FIG. 6A is a flowchart illustrating a method of operating a memory device, FIG. 6B illustrates a table for voltage conditions during an erase operation of FIG. 6A, and FIG. 6C illustrates a timing diagram of a voltage applied to each line during dummy cell programming. Hereinafter, descriptions regarding FIGS. 6A to 6C will be made with reference to FIG. 5B.

Referring to FIG. 6A, in operation S10, the memory device 100 may perform an erase operation on the dummy cells DC11 and DC12. For example, referring to FIG. 6B, during the erase operation for the dummy cells DC11 and DC12, the string select line SSL may be floated, and a word line erase voltage Vwe may be applied to the first dummy word line DWL1. The ground select line GSL may be floated, and an erase voltage V_ERS may be applied to the substrate SUB.

The substrate SUB and the surface layer DS1 may include silicon materials having the same conductivity. Thus, the erase voltage V_ERS applied to the substrate SUB may be transferred to the surface layer DS1. For example, the erase voltage V_ERS may be higher than the word line erase voltage Vwe. Since the ground select line GSL and the string select line SSL are in a floating state, when a voltage of the surface layer DS1 is changed, the ground select line GSL and the string select line SSL may be influenced by coupling. That is, when the voltage of the surface layer DS1 is increased to the erase voltage V_ERS, voltages of the ground select line GSL and the string select line SSL may also be increased. Thus, a ground select transistor and a string select transistor may be prevented from being erased.

For example, the word line erase voltage Vwe applied to the first dummy word line DWL1 may be lower than the erase voltage V_ERS and may be a ground voltage. Due to a voltage difference between the surface layer DS1 and the first dummy word line DWL1, FN tunnelling may occur in the dummy cells DC11 and DC12, and thus, the dummy cells DC11 and DC12 may be erased.

Next, in operation S20, the memory device 100 may perform erase-verification on the dummy cells DC11 and DC12 and determine whether the erase-verification is passed. For example, when the memory device 100 determines that the erasure for the dummy cells DC11 and DC12 is not completed, the memory device 100 may perform the erase operation on the dummy cells DC11 and DC12 again.

In operation S30, the memory device 100 may program the dummy cells DC11 and DC12 based on determining that the erase operation for the dummy cells DC11 and DC12 is completed. For example, referring to FIG. 6C, a turn-on voltage V_TN_G may be applied to the ground select line GSL earlier than a first time point t1 by as much as a preset time period. The turn-on voltage V_TN_G may be a turn-on voltage of the ground select transistor GST. In addition, at the first time point t1, a pass voltage V_PASS may be applied to a word line WL and the dummy word line DWL. The turn-on voltage V_TN_G may be applied to the ground select line GSL before the word line WL and the dummy word line DWL, whereby timings may be separated to prevent boosting of a channel. Thus, hot carrier injection (HCI) may be prevented. Since a ground voltage GND is applied to the common source line CSL from the first time point t1 to a fourth time point t4, a voltage of a channel formed in each of a dummy hole and a channel hole may be a ground voltage in a period between the first time point t1 and a second time point t2.

Next, at the second time point t2, a turn-off voltage may be applied (or recovered) to the ground select line GSL. In addition, an inhibit voltage V_INH may be applied to a bit line BL, and a voltage having a level equal to or higher than the sum of levels of a turn-on voltage V_TN_S and the pass voltage V_PASS may be applied to the string select line SSL.

Next, at a third time point t3, a program voltage V_PGM may be applied to the dummy word line DWL. The program voltage V_PGM may be set such that threshold voltages of the dummy cells DC11 and DC12 are higher in level than turn-on voltages of the main cells MC11 to MC82. That is, the program voltage V_PGM may be set such that the threshold voltages of the dummy cells DC11 and DC12 are higher in level than threshold voltages of the main cells MC11 to MC82. For example, the dummy cells DC11 and DC12 may be programmed based on an FN-stress manner, according to the program voltage V_PGM. After the program operation for the dummy cells DC11 and DC12 is completed, at the fourth time point t4, the voltage of each line may be recovered.

Figure 7:
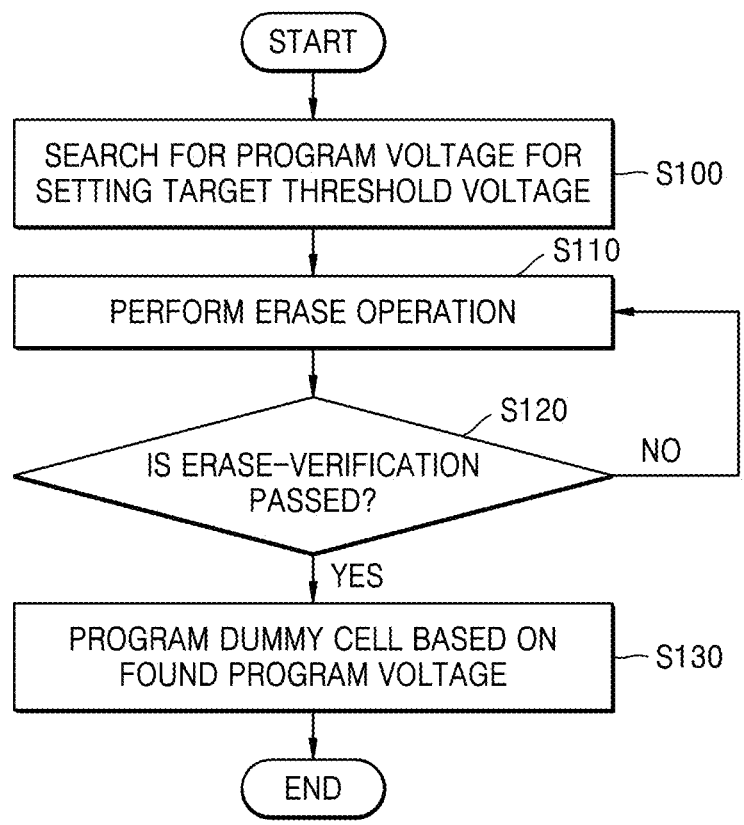
FIG. 7 is a flowchart illustrating a method of operating a memory device, according to an example embodiment.

FIG. 7 is a flowchart illustrating a method of operating a memory device, according to an example embodiment. Hereinafter, descriptions regarding FIG. 7 will be made with reference to FIG. 5B.

Referring to FIG. 7, to set a target threshold voltage for the dummy cells DC11 and DC12, in operation S100, the memory device 100 may search for a program voltage to be applied to the dummy cells DC11 and DC12.

For example, after performing a program operation on the main cells MC11 to MC82, the memory device 100 may search for a program voltage for programming the dummy word line DWL by comparing the target threshold voltage with a threshold voltage formed by the performing of the program operation. In an example embodiment, the memory device 100 may program the main cells MC11 to MC82 by the same method as the method of programming the dummy cells DC11 and DC12, which has been described with reference to FIG. 6C.

Next, in operation S110, the memory device 100 may perform an erase operation on the dummy cells DC11 and DC12, and in operation S120, may perform erase-verification.

As the erase operation is completed, in operation S130, the memory device 100 may perform a program operation on the dummy cells DC11 and DC12 based on the program voltage found in operation S100.

Figure 8A:
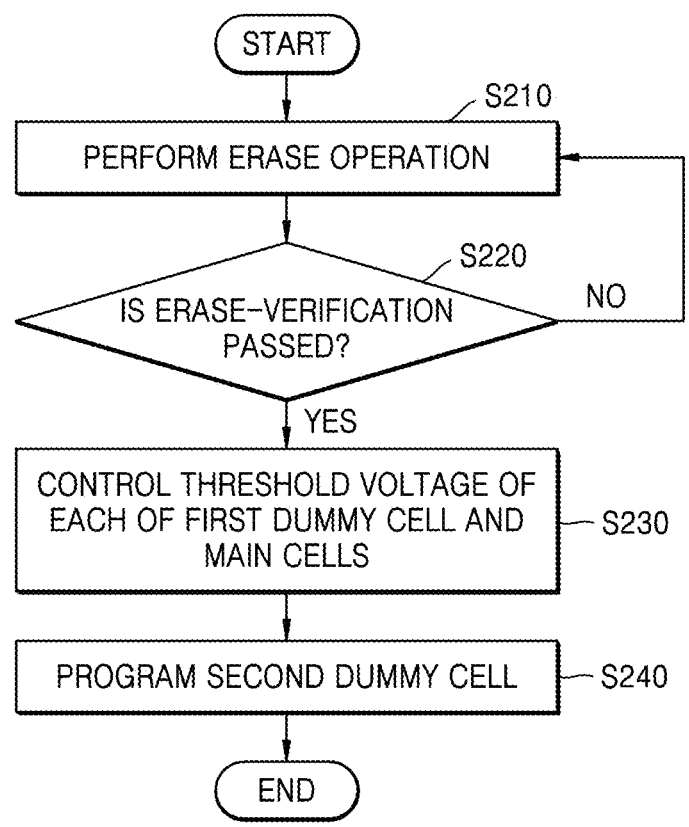
FIGS. 8A to 8C are diagrams illustrating a method of operating a memory device, according to another example embodiment.
Figure 8B:
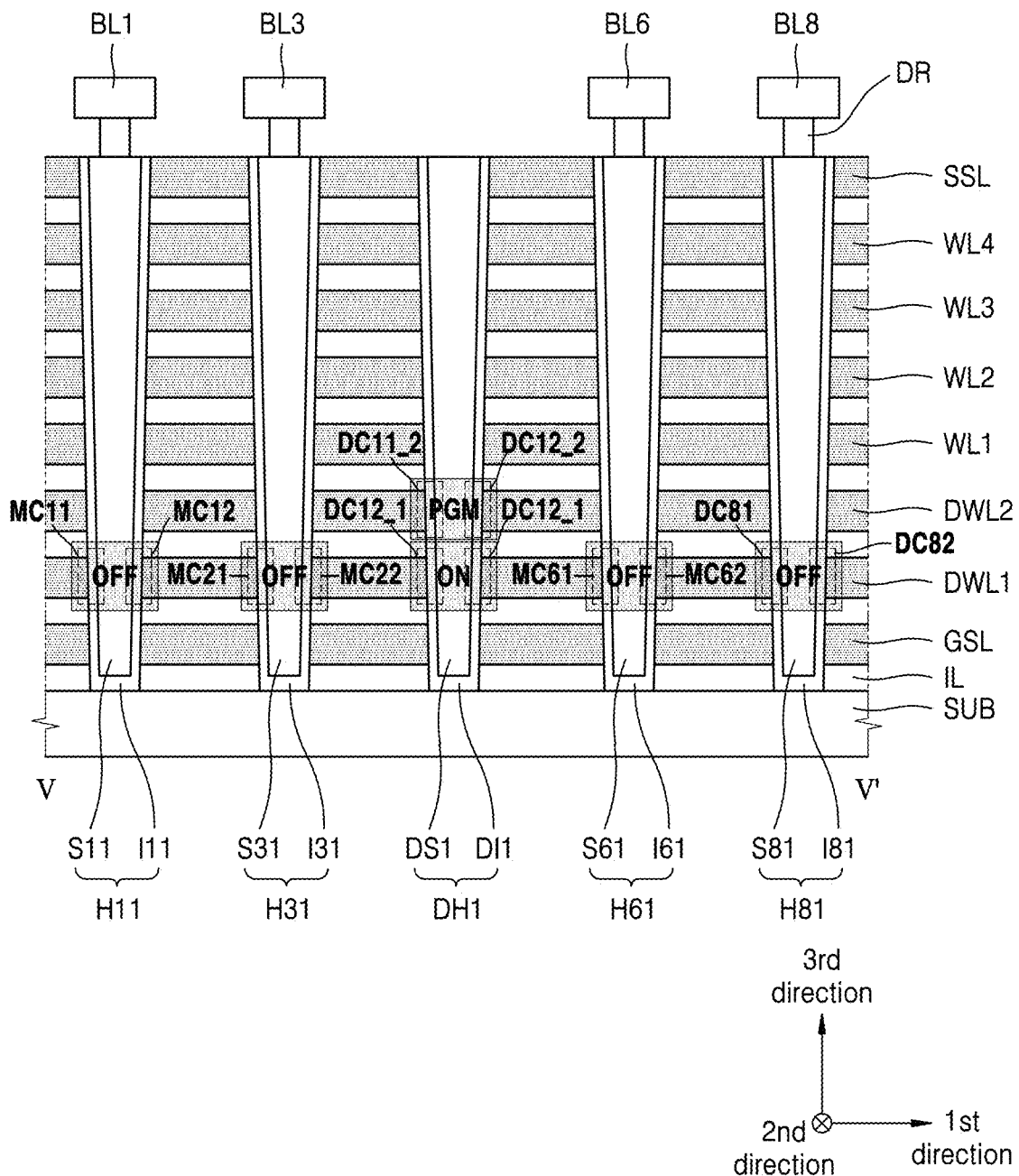
Figure 8C:
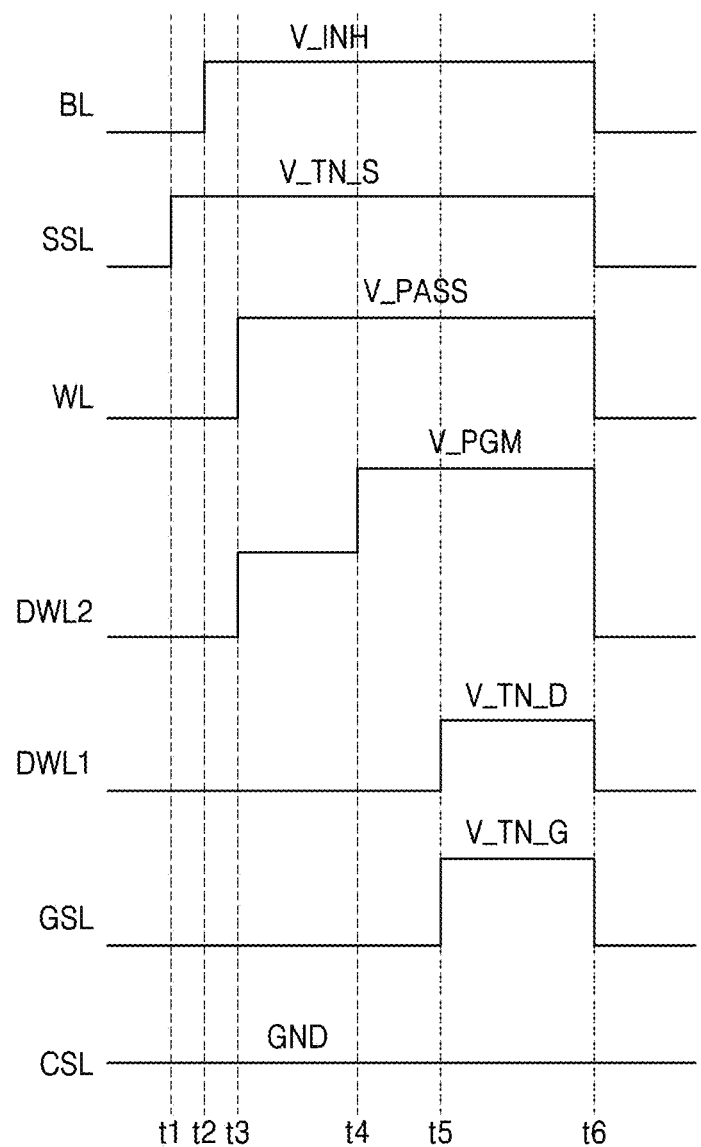

FIGS. 8A to 8C are diagrams illustrating a method of operating a memory device, according to another example embodiment. Specifically, FIG. 8A is a flowchart illustrating a method of operating a memory device, FIG. 8B illustrates a cross-sectional view of the memory device, and FIG. 8C illustrates a timing diagram of a voltage applied to each line when a second dummy cell is programmed. In descriptions regarding FIGS. 8A to 8C, descriptions already given above will be omitted for convenience of description.

Referring to FIGS. 8A and 8B, in operation S210, the memory device 100 may perform an erase operation on first dummy cells DC11_1 and DC12_1 and second dummy cells DC11_2 and DC12_2. For example, the first dummy cells DC11_1 and DC12_1 may be formed as the dummy hole DH1 and the first dummy word line DWL1, and the second dummy cells DC11_2 and DC12_2 may be formed as the dummy hole DH1 and a second dummy word line DWL2 that is arranged over the first dummy word line DWL1. In other words, the second dummy cells DC11_2 and DC12_2 may be respectively arranged over the first dummy cells DC11_1 and DC12_1.

Next, in operation S220, the memory device 100 may perform erase-verification on the first and second dummy cells DC11_1, DC12_1, DC11_2, and DC12_2 and may determine whether the erase-verification is passed.

In operation S230, the memory device 100 may perform a threshold voltage control operation on each of the first dummy cells DC11_1 and DC12_1 and the main cells MC11 to MC82 based on determining that the erase operation for the first and second dummy cells DC11_1, DC12_1, DC11_2, and DC12_2 is completed.

In an example embodiment, the memory device 100 may perform the threshold voltage control operation on each of the first dummy cells DC11_1 and DC12_1 and the main cells MC11 to MC82 by applying a word line program voltage to the first dummy word line DWL1 and applying a drive voltage to the bit lines BL1, BL3, B16, and BL8. Thus, as the dummy hole DH1 not connected to a bit line is boosted, the first dummy cells DC11_1 and DC12_1 may not be programmed, and each of the main cells MC11 to MC82 may be programmed. In other words, through operation S230, levels of the threshold voltages of the main cells MC11 to MC82 may be higher than levels of the threshold voltages of the dummy cells DC11 and DC12.

Next, in operation S240, the memory device 100 may program the second dummy cells DC11_2 and DC12_2. For example, referring to FIG. 8C, at the first time point t1, the turn-on voltage V_TN_S may be applied to the string select line SSL. The turn-on voltage V_TN_S may be a turn-on voltage of the string select transistor SST.

Thus, the string select transistor SST may be turned on, and then, the inhibit voltage V_INH may be applied to each of the bit lines BL1, BL3, B16, and BL8 at the second time point t2.

Next, at the third time point t3, the pass voltage V_PASS may be applied to word lines WL1 to WL4, and a voltage having a desired (or, alternatively, preset) level may be applied to the second dummy word line DWL2. For example, at the third time point t3, a voltage having a lower level than the program voltage V_PGM that is to be subsequently applied may be applied to the second dummy word line DWL2.

Next, at the fourth time point t4, the program voltage V_PGM may be applied to the second dummy word line DWL2, and at a fifth time point t5, the turn-on voltage V_TN_G may be applied to the ground select line GSL. For example, the turn-on voltage V_TN_G may be a turn-on voltage of the ground select transistor GST. In addition, at the fifth time point t5, a turn-on voltage V_TN_D may be applied to the first dummy word line DWL1. In an example embodiment, the turn-on voltage V_TN_D may be a voltage having a level that is lower than those of the threshold voltages of the main cells MC11 to MC82 and higher than those of the threshold voltages of the first dummy cells DC11_1 and DC12_1. In other words, as the turn-on voltage V_TN_D is applied, the first dummy cells DC11_1 and DC12_1 may be turned on, and the main cells MC11 to MC82 may be turned off. Thus, at the fifth time point t5, the ground select transistor GST may be turned on, and a program operation may be performed on the second dummy cells DC11_2 and DC12_2. For example, at the fifth time point t5, as the dummy hole DH1 is connected to the common source line CSL to which the ground voltage GND is applied, a program operation in a HCI manner may be performed on the second dummy cells DC11_2 and DC12_2. After the program operation for the second dummy cells DC11_2 and DC12_2 is completed, at a sixth time point t6, the voltage of each line may be recovered.

In another example embodiment, to set a target threshold voltage for the second dummy cells DC11_2 and DC12_2, the memory device 100 may further search for a program voltage to be applied to the second dummy cells DC11_2 and DC12_2. For example, before the performing of the erase operation in operation S210, the memory device 100 may perform a program operation on the main cells MC11 to MC82 and may search for the program voltage for setting the target threshold voltage, by sensing a threshold voltage caused by the performing of the program operation. In an example embodiment, the memory device 100 may perform a program operation on the main cells MC11 to MC82 in the same manner as in the program operation performed in operation S240 and may search for the program voltage for setting the target threshold voltage, by sensing a threshold voltage caused by the performing of the program operation.

Figure 9:
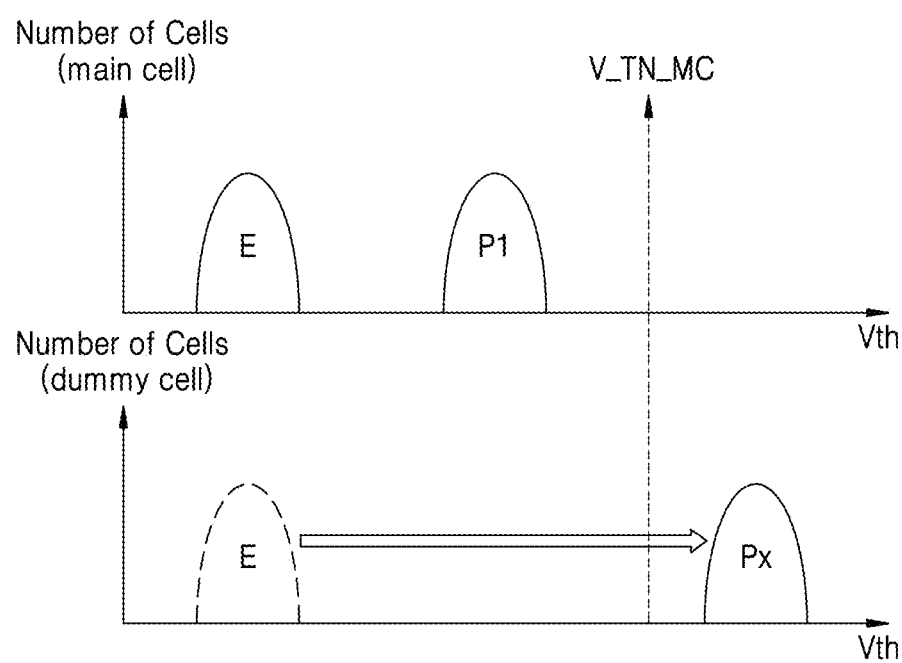
FIG. 9 illustrates a dispersion of threshold voltages for each of main cells and dummy cells after performing a method of operating a memory device, according to an example embodiment.

FIG. 9 illustrates a threshold voltage dispersion for each of main cells and dummy cells after performing a method of operating a memory device, according to an example embodiment.

Referring to FIG. 9, the main cells MC11 to MC82 may have a threshold voltage dispersion E corresponding to an erase state or a threshold voltage dispersion P1 corresponding to a first program state, according to an operation of the memory device 100. In the present example embodiment, although main cells are described as being programmed in an SLC manner, this is merely an example, and example embodiments of the inventive concepts are not limited thereto.

The dummy cells DC11 and DC12 according to the operation method of FIGS. 6A and 7 described above or the second dummy cells DC11_2 and DC12_2 according to the operation method of FIG. 8A described above may have a threshold voltage dispersion Px at a higher level than the threshold voltage dispersion P1 corresponding to the first program state of the main cells. For example, dummy cells DC11, DC12, DC11_2, and DC12_2 may have a threshold voltage dispersion E corresponding to an erase state according to an erase operation and then have a threshold voltage dispersion Px according to a program operation.

The dummy cells DC11, DC12, DC11_2, and DC12_2 have a voltage at a higher level than a level of a turn-on voltage V_TN_MC of the main cells MC11 to MC82, whereby the dummy cells DC11, DC12, DC11_2, and DC12_2 may be turned off when the main cells MC11 to MC82 are turned on for memory operations. In other words, during the memory operations, the dummy hole DH1 may be electrically separated from the substrate SUB. Therefore, during the memory operations such as data reading, parasitic capacitance generated between the dummy hole DH1 and the gate conductive layers may be reduced, and thus, electrical characteristics of the memory device 100 may be improved due to reduced loading.

Figure 10:
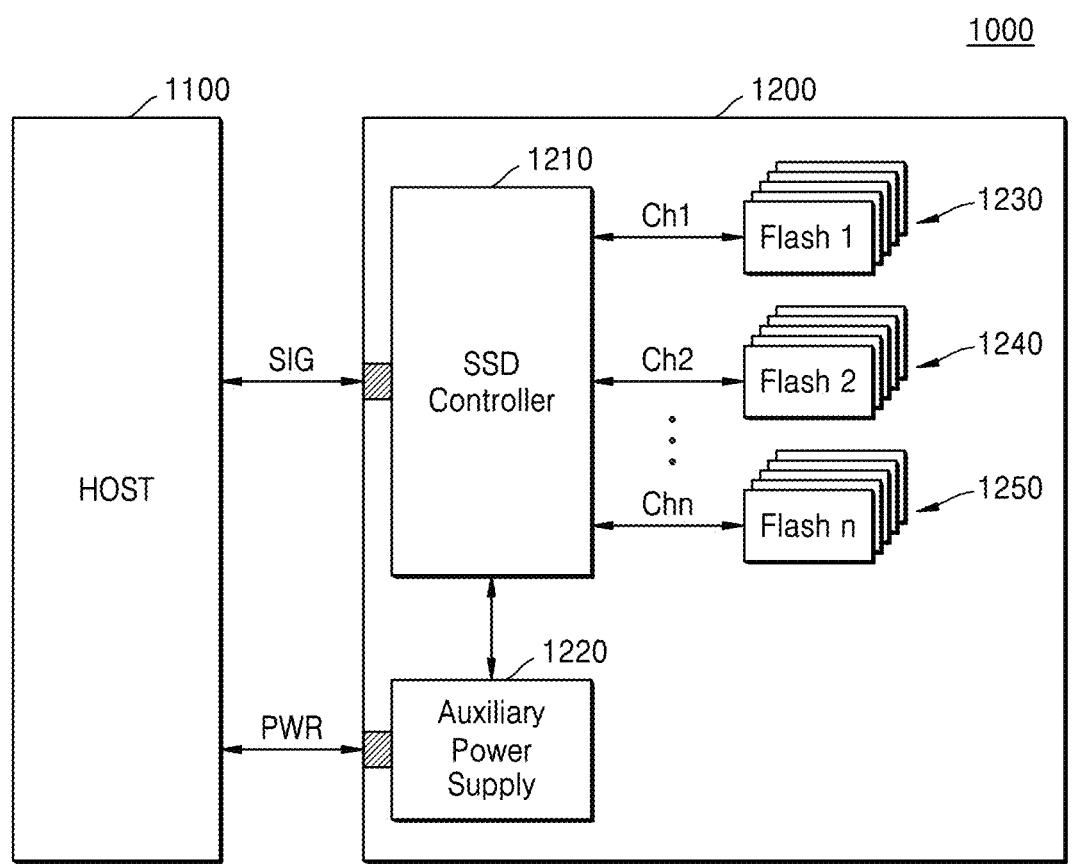
FIG. 10 is a block diagram illustrating an example in which a memory device according to example embodiments is applied to a Solid State Drive (SSD) system.

FIG. 10 is a block diagram illustrating an example in which a memory device according to example embodiments is applied to an SSD system.

Referring to FIG. 10, an SSD system 1000 may include a host 1100 and an SSD 1200. The SSD 1200 may transmit signals to and receive signals from the host 1100 via a signal connector and may receive power, which is input thereto, via a power connector. The SSD 1200 may include an SSD controller 1210, an auxiliary power supply 1220, and memory devices 1230, 1240, and 1250. Here, the SSD 1200 may be implemented according to the example embodiments described with reference to FIGS. 1 to 9. Each of the memory devices 1230, 1240, and 1250 may include dummy cells, and each of the dummy cells may be programmed to have a threshold voltage higher than a threshold voltage of each main cell. Thus, loading caused by dummy holes not connected to bit lines may be reduced during memory operations, and electrical characteristics of the memory device may be improved.

Figure 11:
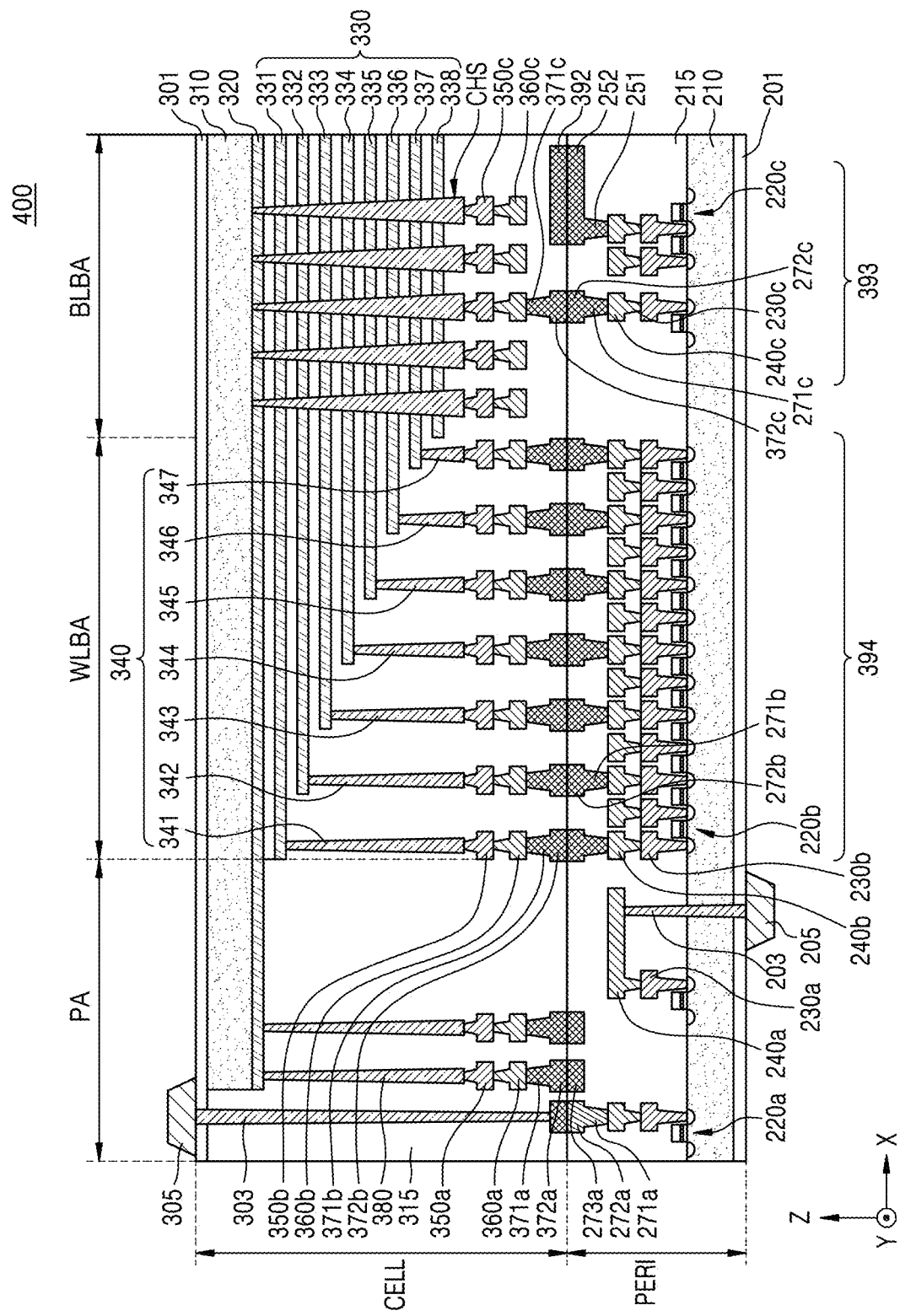
FIG. 11 illustrates a memory device having a chip-to-chip (C2C) structure, according to exemplary embodiments of the inventive concept.

FIG. 11 illustrates a memory device having a chip-to-chip (C2C) structure, according to exemplary embodiments of the inventive concept.

Referring to FIG. 11, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrate in FIG. 11, although the first metal layers 230a, 230b, and 230c and the second metal layers 240a, 240b, and 240 care shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to c in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 11, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 11, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 11, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 11, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While example embodiments of the inventive concepts have been particularly shown and described with reference to some example embodiments thereof, it will be understood by those skilled in the art that various changes in form and details may be made therein without departing from the spirit and scope of the following claims. In addition, it should be understood that particular terms used herein are only for the purpose of describing the example embodiments and are not intended to limit example embodiments the inventive concepts. Therefore, the scope of the example embodiments of the inventive concepts should be defined by the accompanying claims and equivalents thereof.

What is claimed is:

1. A method of operating a memory system, the memory system including a memory device and a memory controller to control the memory device, the memory device including a substrate, at least one dummy word line over the substrate, a plurality of word lines over the at least one dummy word line; and a plurality of vertical holes, the plurality of vertical holes extending through the at least one dummy word line and the plurality of word lines in a direction perpendicular to the substrate, the plurality of vertical holes including channel holes and dummy holes, the channel holes being ones of the plurality of vertical holes connected to a bit line, the method comprising:
   receiving at least one of requests from a host;
   performing an erase operation on dummy cells, the dummy cells each including one of the at least one dummy word line and ones of the dummy holes;
   verifying the erase operation; and
   performing a program operation on at least one of the dummy cells such that threshold voltages of the dummy cells are higher than threshold voltages of main cells, the main cells each including one of the at least one dummy word line and ones of the channel holes.

2. The method according to claim 1, wherein the at least one dummy word line includes a first dummy word line and a second dummy word line, the second dummy word line being over the first dummy word line, and the performing the program operation comprises:

controlling the threshold voltages of each of first dummy cells and the main cells, the first dummy cells being ones the dummy cells that include the first dummy word line and ones the dummy holes.

3. The method according to claim 2, wherein the controlling the threshold voltages of each of the first dummy cells and the main cells comprises:

applying a program voltage to the first dummy word line; and applying a drive voltage to the bit line.

4. The method according to claim 3, wherein the performing the program operation on the dummy cells comprises:

performing the program operation on each of second dummy cells after the controlling of the threshold voltages of each of the first dummy cells and the main cells such that the second dummy cells have threshold voltages higher than the threshold voltages of the main cells, the second dummy cells including the second dummy word line and ones of the dummy holes.

5. The method according to claim 4, wherein the performing of the program operation on each of the second dummy cells comprises:

applying a turn-on voltage to the first dummy word line for a time period, the turn-on voltage having a lower voltage level than the threshold voltages of the main cells and higher than the threshold voltages of the first dummy cells.

6. The method according to claim 5, wherein the performing the program operation on each of the second dummy cells comprises:

applying the program voltage to the second dummy word line for at least a portion of the time period.

7. The method according to claim 1, further comprising:
performing the program operation on the main cells; and
searching for a dummy program voltage to program at least one of the dummy cells based on the program operation on the main cells.

8. The method according to claim 7, wherein the performing the program operation on the dummy cells comprises:

performing the program operation on the at least one of the dummy cells based on the dummy program voltage.

9. The method according to claim 7, wherein the performing the program operation on the main cells comprises:

applying a first voltage having a first level to the at least one dummy word line for a first portion of a time period; and applying a second voltage having a second level to the at least one dummy word line for a second portion of the time period, the second level being higher than the first level.

10. The method according to claim 9, wherein the memory device further includes a ground select line between the substrate and the at least one dummy word line, and the applying of the second voltage having the second level to the at least one dummy word line comprises:

applying a turn-on voltage to the ground select line.

11. The method according to claim 9, wherein the memory device further includes a string select line between the plurality of word lines and the bit line, and the performing of the program operation on the main cells comprises:

applying a turn-off voltage to the string select line for the time period.

12. The method according to claim 1, wherein the memory device further includes a ground select line between the substrate and the at least one dummy word line, and the performing of the program operation on the dummy cells comprises:

first applying a turn-on voltage to the ground select line;
second applying, for a first time period, a pass voltage to the at least one dummy word line and the plurality of word lines after the first applying;
third applying, for a second time period, a turn-off voltage to the ground select line and the pass voltage to the at least one dummy word line and the plurality of word lines; and
fourth applying, for a third time period, the turn-off voltage to the ground select line and a program voltage to the at least one dummy word line.

13. The method according to claim 12, wherein the memory device further includes a string select line between the plurality of word lines and the bit line, and the performing of the program operation on the dummy cells comprises:

applying, for the second time period, an inhibit voltage to the bit line and a string select voltage to the string select line, the string select voltage being equal to or greater than a sum of the turn-on voltage and the pass voltage.

14. The method according to claim 12, wherein the memory device further includes a common source line in a portion of the substrate, and the performing of the program operation on the dummy cells comprises:

applying, for the first time period to the third time period, a ground voltage to the common source line.

15. A method of operating a memory system, the memory system including a memory device and a memory controller to control the memory device, the memory device including a substrate, a first dummy word line over the substrate, a second dummy word line over the first dummy word line, a plurality of word lines over the second dummy word line, and a plurality of vertical holes, the plurality of vertical holes extending through the first dummy word line, the second dummy word line, and the plurality of word lines in a direction perpendicular to the substrate, each of the plurality of vertical holes including one of first vertical holes and second vertical holes, the method comprising:

receiving at least one of requests from a host;
performing an erase operation on first dummy cells and second dummy cells, the first dummy cells including ones of the first vertical holes and the first dummy word line, and the second dummy cells including ones of the second vertical holes and the second dummy word line;
verifying the erase operation;
controlling a threshold voltage of each of the first dummy cells and main cells in response to verifying that the erase operation is completed, the main cells including ones the second vertical holes and the first dummy word line; and
programming the second dummy cells.

16. The method according to claim 15, wherein the memory device further includes a plurality of bit lines connected to respective ones of the second vertical holes, and the controlling the threshold voltage comprises:

forming a first threshold voltage in the main cells by applying a drive voltage to the plurality of bit lines; and
forming a second threshold voltage in the first dummy cells, the second threshold voltage being lower than the first threshold voltage by applying a program voltage to the first dummy word line.

17. The method according to claim 16, wherein the programming the second dummy cells comprises:

applying a voltage to the first dummy word line, the voltage being lower than that of the first threshold voltage and higher than the second threshold voltage.

18. The method according to claim 15, wherein the memory device further includes a string select line over the plurality of word lines and a plurality of bit lines over the string select line, the plurality of bit lines being connected to respective ones of the second vertical holes, and the programming of the second dummy cells comprises:

applying, for a time period, a turn-on voltage to the string select line; and applying, for at least a portion of the time period, an inhibit voltage to the plurality of bit lines.

19. The method according to claim 18, wherein the programming the second dummy cells comprises:

applying, for at least the portion of the time period, a pass voltage to the plurality of word lines and a program voltage to the second dummy word line.

20. A Solid State Drive (SSD) comprising:

a non-volatile memory device; and a SSD controller to control the non-volatile memory device, wherein the non-volatile memory device includes, a substrate;

a plurality of gate conductive layers including at least one dummy word line over the substrate and a plurality of word lines over the at least one dummy word line;

a plurality of bit lines over the plurality of gate conductive layers, the plurality of bit lines being apart from each other in a first direction and extending in a second direction, the second direction being perpendicular to the first direction;

a plurality of vertical holes extending through the plurality of gate conductive layers in a direction perpendicular to the substrate, the plurality of vertical holes including channel holes and dummy holes, the channel holes being ones of the plurality of vertical holes connected to respective ones of the plurality of bit lines;

dummy cells each including one of the at least one dummy word line and ones of the dummy holes;

main cells each including one of the plurality of word lines and ones of the channel holes; and a row decoder configured to apply a voltage to each of the plurality of gate conductive layers, wherein the SSD controller is configured to receive at least one of signals from a host and to provide a command and an address to the non-volatile memory device such that when a turn-on voltage associated with the main cells is applied to the at least one dummy word line, the dummy cells are configured to be turned off.

* * * * *